US006867105B2

(12) United States Patent
Stengl et al.

(10) Patent No.: US 6,867,105 B2
(45) Date of Patent: Mar. 15, 2005

(54) BIPOLAR TRANSISTOR AND METHOD OF FABRICATING A BIPOLAR TRANSISTOR

(75) Inventors: Reinhard Stengl, Stadtbergen (DE); Thomas Meister, Taufkirchen (DE); Herbert Schäfer, Höhenkirchen-Siegertsbrunn (DE); Martin Franosch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/215,152

(22) Filed: Aug. 8, 2002

(65) Prior Publication Data
US 2003/0020139 A1 Jan. 30, 2003

Related U.S. Application Data

(63) Continuation of application No. PCT/EP01/01324, filed on Feb. 7, 2001.

(30) Foreign Application Priority Data
Feb. 8, 2000 (DE) .......................................... 100 05 442

(51) Int. Cl.$^7$ ............................................ H01L 21/331
(52) U.S. Cl. ...................... 438/320; 438/364; 438/365; 438/366; 257/197
(58) Field of Search ................................ 438/320, 364, 438/366, 365, 312; 257/197

(56) References Cited

U.S. PATENT DOCUMENTS

| 5,296,391 A | | 3/1994 | Sato et al. | |
| 5,326,718 A | | 7/1994 | Klose et al. | |
| 5,391,503 A | | 2/1995 | Miwa et al. | |
| 5,422,203 A | | 6/1995 | Guyomard et al. | |
| 5,432,104 A | * | 7/1995 | Sato ............................ | 438/366 |
| 5,504,018 A | * | 4/1996 | Sato ............................ | 438/350 |

(List continued on next page.)

FOREIGN PATENT DOCUMENTS

| EP | 0 476 412 A1 | 3/1992 | |
| EP | 0 535 350 A2 | 4/1993 | |
| EP | 0 600 276 A2 | 6/1994 | |
| EP | 0 768 716 A2 | 4/1997 | |
| JP | 02295127 A | * 12/1990 | ......... H01L/21/331 |
| WO | WO 97/37377 | 10/1997 | |

OTHER PUBLICATIONS

Nauta, B. et al.: "A 70–MS/s 110–mW 8–b CMOS Folding and Interpolating A/D Converter", IEEE, vol. 30, No. 12, Dec. 1995, pp. 1302–1308.
Bult, K. et al.: "A 170mW 10b 50MSample/s CMOS ADC in 1mm", IEEE, 1997, pp. 86, 98–99, 378.
Kattmann, K. et al.: "A Technique for Reducing Differential Non–Linearity Errors in Flash A/D Converters", IEEE, 1991, p. 170.

(List continued on next page.)

Primary Examiner—Paul E Brock, II
(74) Attorney, Agent, or Firm—Laurence A. Greenberg; Werner H. Stemer; Ralph E. Locher

(57) ABSTRACT

A bipolar transistor includes a first layer with a collector. A second layer has a base cutout for a base. A third layer includes a lead for the base. The third layer is formed with an emitter cutout for an emitter. An undercut is formed in the second layer adjoining the base cutout. The base is at least partially located in the undercut. In order to obtain a low transition resistance between the lead and the base, an intermediate layer is provided between the first and the second layer. The intermediate layer is selectively etchable with respect to the second layer. At least in the region of the undercut between the lead and the base, a base connection zone is provided that can be adjusted independent of other production conditions. The intermediate layer is removed in a contact region with the base.

10 Claims, 3 Drawing Sheets

U.S. PATENT DOCUMENTS

| | | | | |
|---|---|---|---|---|
| 5,508,537 | A | * 4/1996 | Imai | 257/197 |
| 5,523,245 | A | * 6/1996 | Imai | 438/366 |
| 5,599,723 | A | * 2/1997 | Sato | 438/320 |
| 5,723,378 | A | * 3/1998 | Sato | 438/309 |
| 5,840,613 | A | 11/1998 | Sato | |
| 5,897,359 | A | 4/1999 | Cho et al. | |
| 5,962,880 | A | * 10/1999 | Oda et al. | 257/198 |
| 6,368,946 | B1 | * 4/2002 | Dekker et al. | 438/488 |
| 6,469,367 | B2 | * 10/2002 | Kondo et al. | 257/592 |

OTHER PUBLICATIONS

Vorenkamp, P. et al.: "A 12-b, 60-MSample/s Cascaded Folding and Interpolating ADC", IEEE, 1997, pp. 1876–1886.

Sato, F. et al.: "Sub-20psec ECL Circuits with 50GHz fmax Self-aligned SiGe HBTs", IEEE, 1992, pp. 15.2.1–15.2.4.

Ohue, E. et al.: "A 7.7-ps CML Using Selective-Epitaxial SiGe HBTs", IEEE, 1998, pp. 97–100.

Van de Grift, R. E. J. et al.: "An 8-bit Video ADC Incorporating Folding and Interpolation Techniques", IEEE, vol. SC-22, No. 6, Dec. 1987, pp. 944–953.

Sato, F. et al.: "A Super Self-Aligned Selectively Grown SiGe Base (SSSB) Bipolar Transistor Fabricated by Cold-Wall Type UHV/CVD Technology", IEEE, vol. 41, No. 8, Aug. 1994, pp. 1373–1378.

Sato, F. et al.: "A "Self-Aligned" Selective MBE Technology for High-Performance Bipolar Transistors", IEEE, 1990, pp. 25.7.1–25.7.4.

* cited by examiner

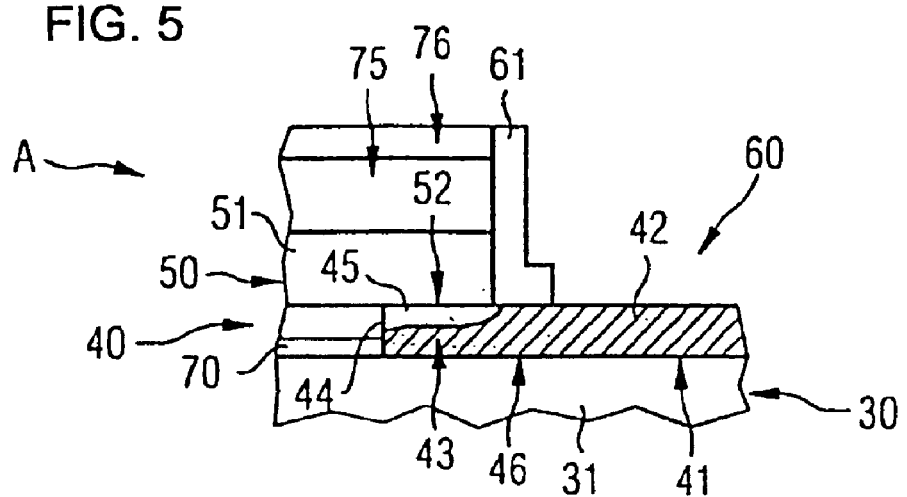

BIPOLAR TRANSISTOR AND METHOD OF FABRICATING A BIPOLAR TRANSISTOR

CROSS-REFERENCE TO RELATED APPLICATION

This application is a continuation of copending International Application No. PCT/EP01/01324, filed Feb. 7, 2001, which designated the United States and was not published in English.

BACKGROUND OF THE INVENTION

Field of the Invention

The present invention relates to a bipolar transistor and to a method for fabricating a bipolar transistor.

Bipolar transistors are generally constructed from two pn junctions disposed close to one another in a semiconductor crystal. In this case, either two n-doped regions are separated from one another by a p-doped region (so-called n-pn transistors) or two p-doped regions are separated by an n-doped region (pnp transistors). The three differently doped regions are referred to as emitter (E), base (B) and collector (C). Bipolar transistors have already been known for a long time and are used in diverse ways. In this case, a distinction is made between so-called individual transistors, which are to be mounted on printed circuit boards or the like and are accommodated in a dedicated housing, and so-called integrated transistors, which are fabricated together with further semiconductor components on a common semiconductor carrier, generally referred to as a substrate.

Conventional bipolar transistors have the disadvantage that they have a relatively large contact resistance. This is can be seen for example in FIG. 1, in which a conventional bipolar transistor is illustrated in a simplified manner.

The bipolar transistor in accordance with FIG. 1 has a base with a base bulk resistance. Furthermore, a lead or feed line is provided which merges with the monocrystalline base in a transition zone. The contact resistance of this transition zone plays a role in the total base resistance of the transistor. It is advantageous for various transistor properties, for example for high switching speeds, if the total base resistance is as small as possible. In accordance with the mode of representation illustrated in FIG. 1, the total base resistance is composed of three components, namely the base lead resistance, the contact resistance (also called base terminal resistance) and also the base bulk resistance of the base. In order to calculate the total base resistance of the transistor, the three individual resistances have to be added. The contact resistance is a proportion which can be reduced and usually makes up at least 15% of the total base resistance.

The need exists, therefore, to create bipolar transistors in which the contact resistance between the base and the lead is minimized.

A conventional bipolar transistor is disclosed for example in European Patent No. EP-A-0 535 350 B1, which was filed for the assignee of the instant application and which corresponds to U.S. Pat. Nos. 5,422,203 and 5,326,718. This document, which forms the starting point for the present invention, describes a method for producing a laterally bounded monocrystalline region in a bipolar transistor. This bipolar transistor is illustrated diagrammatically in FIG. 2. It has a first layer, which is situated on a substrate and in which a collector is provided. Situated on the first layer is a second layer, which has a base cutout, in which a base is situated, the base being provided above the collector. Furthermore, at least one third layer is provided, which is provided on the second layer and which has a lead for the base. In this case, the lead is in direct contact with the base in a transition region. The third layer likewise has an emitter cutout, which is provided above the base and in which an emitter is situated. The transition region between the base and the lead is defined by an undercut of the second layer, which may be a TEOS (tetra-ethyl-ortho-silicate) layer for example. In this case, the base, or the base material, is situated not only in the actual base cutout but also, at least partly, in the region of the undercut.

The resistance of the transition region is set during the fabrication of the base, for example during the epitaxial base deposition, by the dopant redistribution and the redistribution of the lead material. A subsequent thermal treatment, for example a heat treatment operation, for lowering the contact resistance is only possible to a limited extent, however, owing to the limited thermal budget in the base doping profile.

The paper "Sub-20 psec ECL Circuits with 50 GHZ fmax Self-aligned SiGe HBTs" by Sato et al., published in IEEE 1992, IEDM 92, pages 397 to 400, discusses ECL (Emitter-Coupled Logic) circuits and heterojunction bipolar transistors (HBTs) and discloses reducing the base resistance of a bipolar transistor by using the outdiffusion from a boron-containing spacer element.

Another solution is specified in the paper "A 7.7-ps CML Using Selective-Epitaxial SiGe HBTs" by Ohue et al., IEEE 1998, pages 97 to 100 which discusses a current-mode logic (CML) using heterojunction bipolar transistors (HBTs). According to this paper, an additional layer made of undoped polysilicon is introduced at the level of the selectively deposited base. This layer serves as a silicon source during the so-called prebake and during the deposition. It thus prevents the formation of shrink holes in the region of the undercut and is thereby intended to reduce the contact resistance.

SUMMARY OF THE INVENTION

It is accordingly an object of the invention to provide a bipolar transistor which overcomes the above-mentioned disadvantages of the heretofore-known bipolar transistors of this general type and which has the smallest possible contact resistance and thus total base resistance. A further object of the invention is to provide an improved method for fabricating a bipolar transistor.

With the foregoing and other objects in view there is provided, in accordance with the invention, a bipolar transistor, including:

a substrate;

a first layer disposed on the substrate;

a collector disposed in the first layer;

a second layer disposed on the first layer, the second layer having a base cutout formed therein;

a base disposed in the base cutout above the collector;

a third layer disposed on the second layer, the third layer including a lead for the base;

the lead and the base defining a transition region therebetween, the lead being in contact with the base at the transition region;

the third layer having an emitter cutout formed therein, the emitter cutout being provided above the base;

an emitter disposed in the emitter cutout;

the second layer having an undercut formed therein, the undercut adjoining the base cutout and being disposed between the first layer and the third layer, the undercut having given regions, the base extending at least into the given regions of the undercut;

an intermediate layer disposed between the first layer and the second layer, the intermediate layer being selectively etchable with respect to the second layer;

a base terminal region provided at least at the undercut between the lead and the base; and the intermediate layer defining a contact region at the base and having a cutout formed therein at the contact region.

In other words, in accordance with the first aspect of the present invention, the object of the invention is achieved through the use of a bipolar transistor having a first layer, which is situated on a substrate and in which a collector is provided, a second layer, which is situated on the first layer and has a base cutout, in which a base is situated, the base being provided above the collector, at least one further, third layer, which is provided on the second layer and which has a lead for the base, the lead being in direct contact with the base in a transition region and the third layer having an emitter cutout, which is provided above the base and in which an emitter is situated, and having at least one undercut, which is provided in the second layer in a manner adjoining the base cutout between the first and third layer, the base, at least in regions, also being situated in the undercut. According to the invention, the bipolar transistor is characterized in that an intermediate layer is provided between the first and second layer, in that the intermediate layer is formed such that it can be etched selectively with respect to the second layer, in that a base terminal region is provided at least in the region of the undercut between lead and base, and in that the intermediate layer is removed in the contact region with the base.

The bipolar transistor according to the invention makes it possible to reduce the contact resistance—and thus the total base resistance.

A fundamental feature of the-present invention is the introduction of an additional layer, namely the intermediate layer. This layer is formed such that it can be etched selectively with respect to the second layer, so that it is not removed during the undercutting in the second layer, that is to say between the first and third layers. As a result, the fabrication conditions for the base terminal region, which is situated between the lead for the base and the base itself, and which thus generates the contact resistance, become freely selectable. The base terminal region can be set independently of other fabrication conditions, for example the base deposition conditions, in a targeted manner such that it generates the smallest possible contact resistance. The way in which this can be done in an advantageous manner is explained in more detail in the further course of the description.

With regard to the advantages, actions, effects and also the method of operation of the bipolar transistor according to the invention, reference is likewise made to the entire contents of the explanations below concerning the method according to the invention.

The intermediate layer may preferably be formed as a nitride layer, in particular as a CVD (chemical vapor deposition) nitride layer. Nitride is used anyway at other locations during the fabrication of the bipolar transistor, so that no additional, new process components, such as, for example, deposition installations or the like, have to be introduced in the production of such nitride layers. The nitride intermediate layer can be particularly readily etched selectively with respect to so-called TEOS materials from which the second layer is advantageously fabricated. The nitride intermediate layer can particularly advantageously be fabricated through the use of a CVD method. CVD methods are vapor phase deposition methods in which selected gases are conducted over a heated substrate on which the desired layer is to be deposited. The process gases react on the hot substrate surface, so that the reaction products produced are the desired layer and gases which are discharged again from the reactor.

Preferably, the second layer may be formed as a TEOS layer, the intermediate layer being formed such that it can be etched selectively with respect to the TEOS layer (tetra-ethyl-ortho-silicate).

The base terminal region may advantageously be deposited selectively. On account of the fact that the base terminal region is made possible independently of other fabrication conditions, for example the base deposition, the process parameters in the fabrication of the base terminal region can be set in such a way that the contact resistance becomes as small as possible. By way of example, the temperature and the doping can be increased during the selective deposition of the base terminal region. This is explained in more detail in connection with the method according to the invention.

Preferably, it is possible for the base terminal region to be or have been "grown out" into the region of the undercut in the transition region between lead and base. In the light of the present invention, "growing out" may be understood to mean, for example, that the lead for the base is extended from the third layer provided therefor into the region of the undercut within the second layer. The base terminal region is thus formed below the overhang which is formed by the third layer and in which it is applied or deposited for example on that surface of the lead which is in direct contact with the region of the undercut.

The base terminal region may advantageously be formed from polysilicon. As a result, the base terminal region is formed for example as a so-called $p^+$-type terminal in which, however, the growth can be set by suitable deposition conditions, such as deposition temperature or the like, and, if desired, the doping can be increased.

In a further refinement, it is possible for the base terminal region not to be in direct contact with the intermediate layer. This means that the base terminal region, during its fabrication in the transition region between the lead and the later base, is applied or deposited in such a way on that surface of the lead which faces the undercut that the thickness of the region does not reach the intermediate layer. A cavity thus remains between the base terminal region and the intermediate layer, in which cavity the base can be formed in a later work step.

The intermediate layer may preferably be formed from a material which can be removed using phosphoric acid. In this case, the intermediate layer is advantageously formed as a nitride layer.

The intermediate layer may, for example, have a thickness of greater than or equal to 4 nm. Particularly if the intermediate layer is formed as a nitride layer, thinner layers would have holes not permitting, for example, selective epitaxial deposition.

In a further refinement, at least one spacer element may be provided in the emitter cutout between emitter and lead for the base. Spacer is generally understood to mean a structure which is, formed along a step and which, in the present case, may serve for example to insulate the emitter provided in the emitter cutout from adjoining layers, for example the third layer. The spacer may be formed from nitride, for example. It may preferably be L-shaped.

The intermediate layer may preferably have a thickness which is less than half the width of the spacer element described above. Of course, thicknesses of the intermediate layer which are in a different ratio to the width of the spacer element are also conceivable. All that is important is that the intermediate layer is significantly thinner than the total width of the spacer element since the latter, if it is embodied in nitride, is likewise thinned during the removal of the nitride intermediate layer in the lower region.

In practice, an advantageous process window results for the thickness of the intermediate layer in the range between 5 nm and half the width of the spacer element.

It goes without saying that the bipolar transistor can also have further layers and additional elements besides the layers and elements described above.

The individual layers and elements of the bipolar transistor can be fabricated and patterned in ways which are known from the prior art. In principle, bipolar transistors are fabricated using various techniques such as, for example, the layer technique, the lithography technique, the etching technique and the doping technique.

With the aid of the layer technique, various layers can be applied on a substrate, which layers are usually patterned, which means that ultimately they remain only in regions. The most important methods for producing layers in the semiconductor industry are the CVD method (chemical vapor deposition), thermal oxidation, sputtering and spin-coating. A further advantageous method provides for layer production through the use of ion implantation.

Some layers required for the bipolar transistor are, for example, so-called epitaxial layers. Epitaxy is understood to mean the monocrystalline growth of a layer on a monocrystalline substrate. In the case of the bipolar transistor, by way of example, the base may be formed as an epitaxial layer.

After their fabrication, the individual layers usually have to be subdivided into a plurality of individual regions, for example interconnects or the like. This patterning can be effected for example through the use of the lithography technique. An essential feature of this technique is that a radiation-sensitive resist layer is irradiated in the desired regions in such a way that the irradiated, or non-irradiated, regions can be removed in a suitable developer. This produces a mask for a subsequent process step, for example an etching method. The mask is stripped off again after the end of the subsequent process step.

With the aid of an etching method—for example a wet-etching method—individual layers can either be removed over the whole area or mask patterns produced lithographically can be transferred into an underlying layer.

With the aid of the doping technique, individual doping atoms can be diffused into structures in a targeted manner, whereby the properties thereof can be altered. By way of example, suitable doping of the base terminal region can result in a reduction of the contact resistance between lead and base. By way of example, suitable doping atoms that are used are boron for p-doped regions and arsenic, phosphorus and antimony for n-doped regions.

The present invention is not restricted to specific processes or method sequences for fabricating and patterning the individual layers and elements. One example of the fabrication of individual layers and structures in a bipolar transistor is described for example in European. Patent No. EP-A-0 535 350, which corresponds to U.S. Pat. Nos. 5,422,203 and 5,326,718 and the disclosure of which is incorporated in this respect in the description of the present invention.

A second aspect of the present invention provides a method for fabricating a bipolar transistor, in particular a bipolar transistor according to the invention as described above, which includes the steps of:

producing a first layer on a substrate and forming a collector in the first layer;

applying an intermediate layer on the first layer;

applying a second layer on the intermediate layer, the intermediate layer being composed of a material that is selectively etchable with respect to a material of the second layer;

forming a third layer on the second layer, the third layer being configured such that the third layer forms a lead for a base;

processing the second layer and the third layer such that a base cutout for the base is formed in the second layer and an emitter cutout for an emitter is formed in the third layer, and such that the base cutout is provided above a collector and the emitter cutout is provided above the base cutout;

forming an undercut in the second layer such that the undercut adjoins the base cutout between the first layer and the third layer and such that the intermediate layer, due to being selectively etchable with respect to the second layer, is not removed when forming the undercut;

producing a base terminal region in contact with the lead in a transition region between the lead and the undercut such that the base terminal region at least partly fills the undercut;

removing a contact region of the intermediate layer, wherein the contact region is not covered with material of the base terminal region in the undercut and wherein the contact region is in direct contact with the base cutout;

forming the base in the base cutout and in a region of the undercut not filled with material of the base terminal region; and forming the emitter above the base.

In other words, according to the invention, firstly, a first layer is produced on a substrate, in which layer a collector is formed. The collector, for example an n-type collector, may be formed in box insulation, which means that it is flanked by insulation elements composed, for example of TEOS material. A buried layer, for example a so-called $n^+$-type buried layer, which is bounded by channel stoppers, for example $p^+$-type channel stoppers, may be provided in the substrate.

In a next step, an intermediate layer is applied on the first layer. This intermediate layer may be formed in the manner as described with regard to the bipolar transistor according to the invention and has the function described there.

Subsequently, a second layer is applied on the intermediate layer, the intermediate layer being composed of a material which can be etched selectively with respect to the material of the second layer. If the intermediate layer is formed as a nitride layer, for example, and the second layer is formed as a TEOS layer, for example, what can be achieved by the selective etchability of the intermediate layer is that the latter is not removed during later undercutting of the second layer.

In the further course of the method, a third layer is formed on the second layer, which third layer is configured in such a way that it forms a lead for a base. The lead is produced by corresponding patterning and doping. This layer may be formed for example from polysilicon (p$^+$-type material).

Subsequently, the second and third layers are processed in such a way that a base cutout for a base is produced in the second layer and an emitter cutout for an emitter is produced in the third layer, the base cutout being formed above the collector and the cutout being formed above the base cutout. These cutouts can be produced by suitable fabrication methods and process steps, as have been outlined further above in a general manner.

Subsequently, an undercut is formed in the second layer in a manner adjoining the base cutout between first and third layer, the intermediate layer not being removed on account of its material which can be etched selectively with respect to the second layer.

A base terminal region in contact with the lead is produced in a transition region produced between the lead and the undercut, which base terminal region at least partly fills the undercut. On account of the intermediate layer, the conditions for the fabrication of the base terminal region, for example corresponding deposition conditions, can be selected freely in this case, the fabrication of the base terminal region can be fabricated independently of other fabrication conditions, for example the base deposition conditions.

Subsequently, that contact region of the intermediate layer which, in the undercut, is not covered with material of the base terminal region and which is in direct contact with the base cutout is removed.

Subsequently, a base is formed in the base cutout and that region of the undercut which is not filled with material of the base terminal region.

Subsequently, an emitter is formed above the base.

The individual layers of the bipolar transistor, or the patterning thereof, can be effected according to one of the methods as outlined above in a general manner. The invention is not restricted to the use of specific methods for fabricating specific layers. Rather, the use of the respectively suitable method, or process step, results from the fabrication conditions for the bipolar transistor. One example for the fabrication of such a bipolar transistor, in particular the sequence of various layer fabrication, lithography, etching and doping steps, is described by way of example in European Patent No. EP-A-0 535 350 which corresponds to U.S. Pat. Nos. 5,422,203 and 5,326,718, whose disclosure content is incorporated by reference in the description of the present invention. With regard to the advantages, actions, effects and also the method of operation of the method according to the invention, reference is likewise made to the entire contents of the above explanations concerning the bipolar transistor according to the invention.

The base terminal region may preferably be deposited selectively.

The base terminal region may be "grown out" in the transition region between the lead and the base in the undercut.

In this case, the base terminal region may be produced in such a way that the intermediate layer is not covered with base terminal region material.

The base terminal region may advantageously be produced independently of the conditions for fabricating the base. Thus, it is possible, for example, that the temperature and the doping are increased for the fabrication of the base terminal region.

The base terminal region may preferably be produced at elevated temperatures of at least 800° C.

By virtue of the fact that the doping of the base terminal region is set freely and independently of the active base or can be set freely, the contact resistance prevailing in the base terminal region can be reduced in a targeted manner. The base terminal region can be doped through the use of the doping technique outlined further above in a general manner.

The intermediate layer may preferably be formed from nitride. This nitride layer can be removed selectively with respect to the second layer, for example a TEOS layer, using phosphoric acid. Subsequently, the base can be fabricated, for example through the use of a selective base deposition.

At least one spacer element may preferably be formed in the emitter cutout, the spacer element forming the function of an insulator. The intermediate layer may preferably be formed with a thickness of at least 4 nm and at most half the width of the spacer element.

Other features which are considered as characteristic for the invention are set forth in the appended claims.

Although the invention is illustrated and described herein as embodied in a bipolar transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a further enlarged diagrammatic partial cross-sectional view of the detail A illustrated in FIG. 3 at, in comparison with FIG. 4, a later stage of the process of fabricating the bipolar transistor.

DESCRIPTION OF THE PREFERRED EMBODIMENTS

Figure 1:
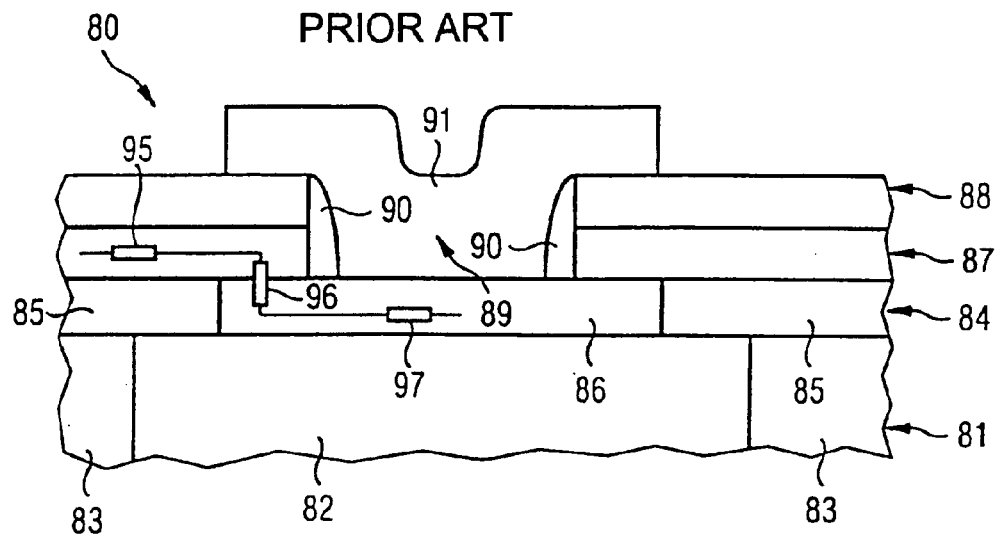
FIG. 1 is a general diagrammatic partial cross-sectional view of a bipolar transistor according to the prior art.

Referring now to the figures of the drawings in detail and first, particularly, to FIG. 1 thereof, there is shown, in a diagrammatic form, a bipolar transistor 80 which is known from the prior art and reveals the calculation of the total base resistance. The bipolar transistor 80 firstly has a first layer 81, in which a collector 82 flanked by insulation elements 83 is formed.

Provided on the first layer 81 is a second layer 84, which has a base 86 surrounded by a dielectric 85. The base 86 is provided above the collector 82. Provided above the second layer 84 is a third layer 87 and also a fourth layer 88 situated thereon. The third layer 87 is formed from polysilicon, for example, and represents a lead or feed line for the base 86.

The fourth layer 88 is again a dielectric layer. The layers 87, 88 have an emitter window 89, in which an emitter 91 is provided. The emitter 91 is situated above the base 86 and is laterally insulated from the layers 87, 88 through the use of corresponding spacer elements 90.

The bipolar transistor 80 has a total base resistance which is formed from three individual components. The first-component is the base lead resistance 95. The second component is the base bulk resistance 97. The third resistance component is the contact resistance 96, also called base terminal resistance. The contact resistance 96 is present in the transition region between the base lead in the third layer 87 and the actual base 86 in the second layer 84. The contact resistance 96 is the proportion of the total base resistance that is to be reduced and amounts to at least 15% of the total resistance of resistance 95 plus resistance 96 plus resistance 97.

Figure 2:
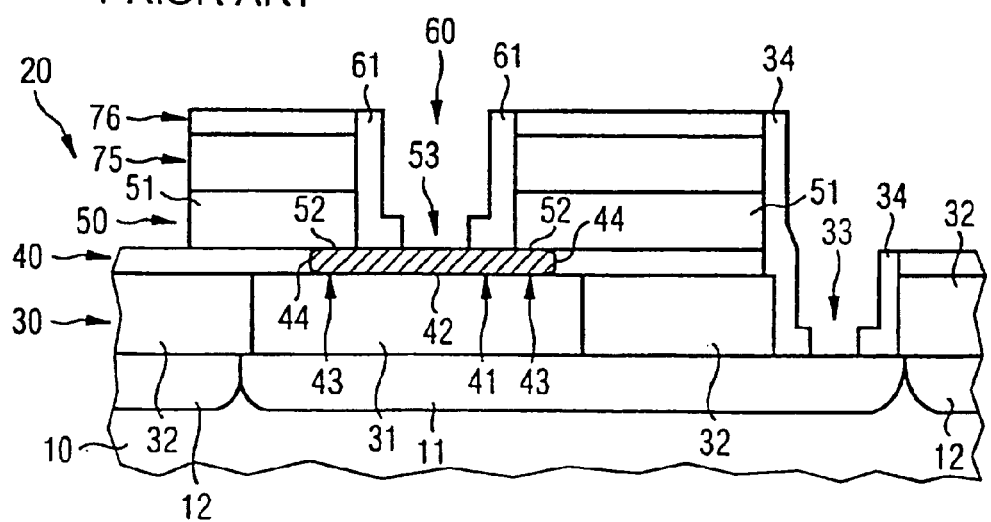
FIG. 2 is a diagrammatic partial cross-sectional view of a further bipolar transistor according to the prior art.

Another bipolar transistor 20, as is known from the prior art, is illustrated in greater detail in FIG. 2. This bipolar transistor 20 forms the starting point for the present invention.

The bipolar transistor 20 firstly has a first layer 30, which is situated on a substrate 10 and in which a collector 31 is provided. The substrate 10 is a p-type silicon substrate which has a buried layer 11, for example an $n^+$-type buried layer, and also channel stoppers 12, for example $p^+$-type channel stoppers.

The collector 31 provided in the first layer 30 may be formed for example as an n-type collector surrounded by insulation elements 32, for example TEOS insulation elements. Furthermore, the first layer 30 has a collector contact 33, which is laterally insulated inter alia from the first layer 30 through the use of spacer elements 34.

A second layer 40 is provided on the first layer 30, which second layer has a base cutout 41 for accommodating a base 42. The second layer 40 may be formed as a TEOS layer.

Provided above the second layer 40 is a third layer 50, which may be formed from polysilicon and which forms the base terminal. To that end, the third layer 50 has correspondingly patterned and doped leads 51 for the base 42. Furthermore, an emitter cutout or recess 53 is provided. Provided above the third layer 50 there may be a further oxide layer 75, for example a TEOS layer, and, on the layer 75, a further layer 76, for example a nitride layer.

In order to fabricate the base 42, firstly the base cutout 41 is fabricated, for example through the use of a suitable etching method. Subsequently, an undercut or underetching 43 is fabricated in the second layer 40, the etching front 44 of which undercut is driven into the second layer 40 to such an extent that the lead 51, in a transition region 52, is in direct contact with the undercut 43 and later with the base 42. By virtue of the undercut 53, the third layer 50 thus forms an overhang. The base 42 can now be fabricated in the base cutout 41 and the at least one undercut 43, for example through the use of an epitaxial layer fabrication method.

In the emitter window 60 bounded by the layers 50, 75, 76, spacer elements 61 which laterally bound the emitter window are produced, which elements may be formed from nitride and laterally insulate an emitter produced in the emitter window 60 from the layers 50, 75, 76.

During the fabrication of the known bipolar transistor 20, the contact resistance (reference symbol 96 in FIG. 1) is generated at the same time as the fabrication of the base 42. Thus, the contact resistance cannot be set independently of other fabrication conditions—for example independently of the base deposition conditions. A subsequent thermal treatment for lowering the contact resistance is only possible to a limited extent owing to the limited thermal budget in the base doping profile.

Figure 3:
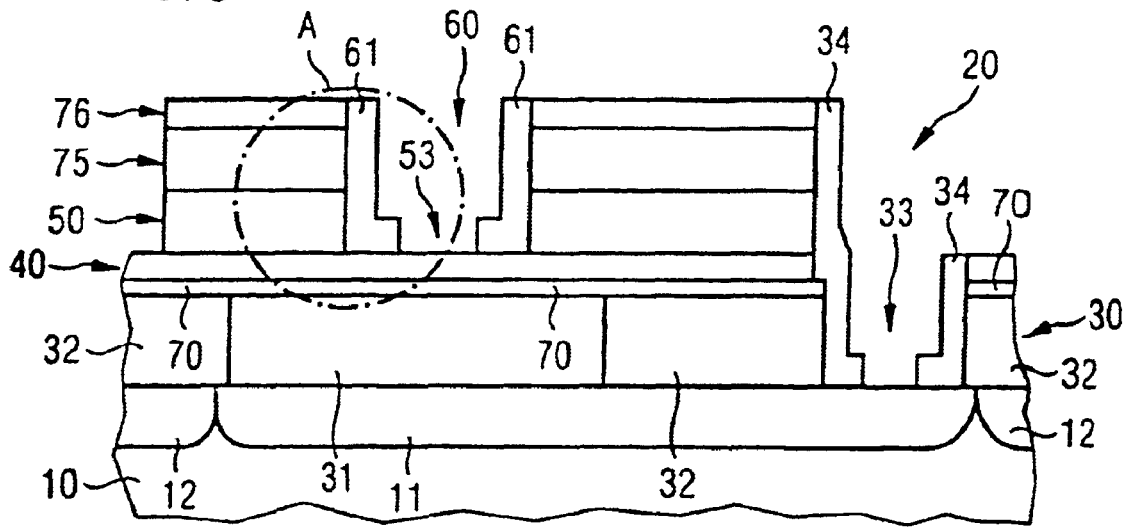
FIG. 3 is a diagrammatic partial cross-sectional view of a bipolar transistor according to the invention.
Figure 4:
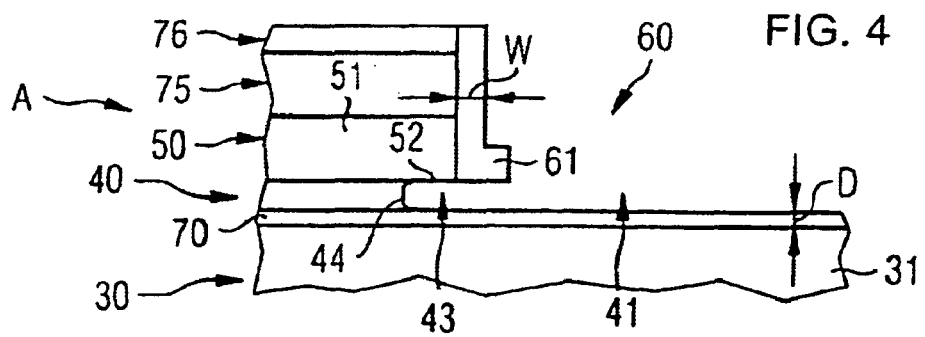
FIG. 4 is an enlarged diagrammatic partial cross-sectional view of the detail A illustrated in FIG. 3 at a specific point in time during the process of fabricating the bipolar transistor.
Figure 4A:
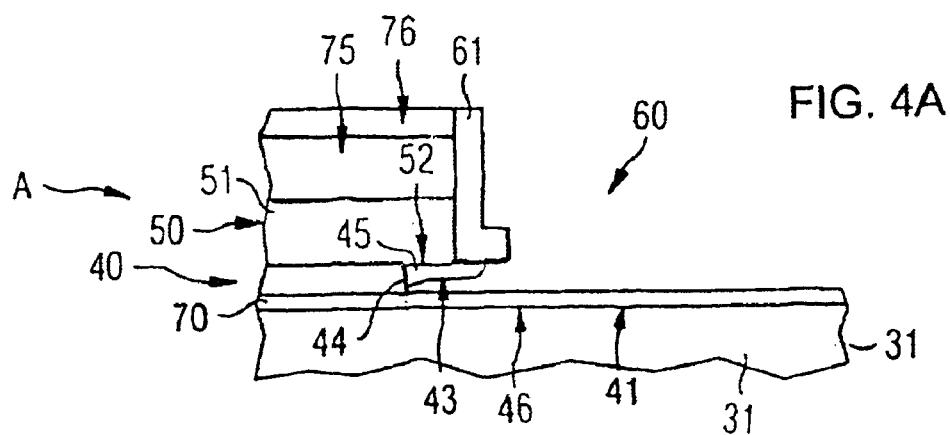

One possibility for reducing the contact resistance and thus the total base resistance in a bipolar transistor exhibiting a basic construction like that of the bipolar transistor 20 in accordance with FIG. 2 is shown with regard to FIGS. 3 to 5.

With regard to its substrate 10, the first layer 30 and also the further layers 40, 50, 75, 76, the bipolar transistor 20 illustrated in FIG. 3 has a construction identical to that of the bipolar transistor illustrated in FIG. 2, and therefore is not described again in order to avoid repetition.

The essential difference between the bipolar transistor illustrated in FIG. 3 and the bipolar transistor shown in FIG. 2 is that the bipolar transistor 20 in accordance with FIG. 3 has an intermediate layer 70, which is formed between the first layer 30 and the second layer 40. The intermediate layer 70 has advantageously been formed as a nitride layer and been deposited selectively on the first layer 30. The material for the intermediate layer 70 is selected in a manner dependent on the material of the second layer 40. The material of the intermediate layer 70 must be chosen such that it can be etched selectively with respect to the material of the layer 40.

Why this is the case and how the reduction of the contact resistance can be achieved will become clear with regard to FIGS. 4 and 5, which are enlarged extract views of the detail A shown in FIG. 3 and illustrate various process steps which proceed one after the other in the fabrication of the bipolar transistor 20.

FIG. 4 illustrates the method step in which an undercut 43 is produced in the layer 40. The etching front 44 of the undercut 43 is driven into the layer 40 to such an extent that the layer 50 and also the layers 75 and 76 situated thereon form an overhang. The lead 50 is uncovered on its underside to such an extent that a transition region 52 is produced, with which the lead 50 is in direct contact with the undercut 43.

Since the intermediate layer 70 formed as a nitride layer can be etched selectively with respect to the second layer 40, preferably formed as a TEOS layer, this layer is not removed during the undercutting of the TEOS layer 40. It is now possible to reduce the contact resistance (reference symbol 96 in FIG. 1) in a targeted manner before the production of the base 42. This is illustrated in detail in FIG. 5.

After the completion of the undercut 43, it is now possible to fabricate a base terminal region 45 under selective deposition conditions, and at elevated temperatures of, for example, more than 800° C. This base terminal region 45, which may be formed from polysilicon and be a $p^+$-type terminal, is produced by being "grown out" below the overhang, that is to say in the region of the undercut 43. The growth of the base terminal region 45 can be set independently of other fabrication conditions, for example the base deposition conditions described in FIG. 2. Thus, by way of example, the temperature and the doping can be set, for example increased, in a targeted manner during the growth of the base terminal region 45. During the deposition operation, the base terminal region 45 grows on the transition region 52 and into the region of the undercut 43. In this case, the deposition conditions can be chosen such that no base terminal region 45 is produced on the intermediate layer 70.

After the completion of the base terminal region 45, the intermediate layer 70 will be removed in the contact region 46, that is to say in the region of the base cutout 41 and also the region of the undercut 43 in which no base terminal region 45 was formed, as a result of which a cavity remained between base terminal region 45 and the intermediate layer 70. The intermediate layer 70 can be removed selectively with respect to the second layer 40 using phosphoric acid. Subsequently, the selective base deposition is carried out. The advantage of this procedure is that the base terminal region 45 can be set independently of the base deposition conditions.

The thickness D of the intermediate layer 70 should be chosen such that it lies between 4 nm and half the width W of the spacer element 61.

We claim:

1. A method for fabricating a bipolar transistor, the method which comprises:

producing a first layer on a substrate and forming a collector in the first layer;

applying an intermediate layer on the first layer;

applying a second layer on the intermediate layer, the intermediate layer being composed of a material that is selectively etchable with respect to a material of the second layer;

forming a third layer on the second layer, the third layer being configured such that the third layer forms a lead for a base;

processing the second layer and the third layer such that a base cutout for the base is formed in the second layer and an emitter cutout for an emitter is formed in the third layer, and such that the base cutout is provided above a collector and the emitter cutout is provided above the base cutout;

forming an undercut in the second layer such that the undercut adjoins the base cutout between the first layer and the third layer and such that the intermediate layer, due to being selectively etchable with respect to the second layer, is not removed when forming the undercut;

producing a base terminal region in contact with the lead in a transition region between the lead and the undercut such that the base terminal region at least partly fills the undercut and a cavity remains between the base terminal region and the intermediate layer such that the base terminal region is not in direct contact with the intermediate layer;

removing a contact region of the intermediate layer, wherein the contact region is not covered with material of the base terminal region in the undercut and wherein the contact region is in direct contact with the base cutout;

forming the base in the base cutout and in a region of the undercut and the cavity not filled with material of the base terminal region; and forming the emitter above the base.

2. The method according to claim 1, which comprises selectively depositing the base terminal region.

3. The method according to claim 1, which comprises growing the base terminal region into the undercut in the transition region between the lead and the base.

4. The method according to claim 1, which comprises producing the base terminal region such that the intermediate layer is not covered with material of the base terminal region.

5. The method according to claim 1, which comprises producing the base terminal region independently of conditions for fabricating the base.

6. The method according to claim 1, which comprises producing the base terminal region at elevated temperatures of at least 800° C.

7. The method according to claim 1, which comprises setting a doping of the base terminal region independently of a doping of the base.

8. The method according to claim 1, which comprises:

providing the intermediate layer as a nitride layer; and using phosphoric acid for the step of removing the contact region of the intermediate layer.

9. The method according to claim 1, which comprises forming at least one spacer element in the emitter cutout.

10. The method according to claim 9, which comprises forming the intermediate layer with a thickness of at least 4 nm and at most equal to half a width of the at least one spacer element.

* * * * *